United States Patent
LaMeres et al.

(10) Patent No.: US 7,025,628 B2
(45) Date of Patent: Apr. 11, 2006

(54) ELECTRONIC PROBE EXTENDER

(75) Inventors: Brock J. LaMeres, Colorado Springs, CO (US); Kenneth W. Johnson, Colorado Springs, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/640,069

(22) Filed: Aug. 13, 2003

(65) Prior Publication Data

US 2005/0037649 A1   Feb. 17, 2005

(51) Int. Cl.
*H01R 11/00* (2006.01)
(52) U.S. Cl. .................. 439/502; 439/482; 324/754
(58) Field of Classification Search ........... 439/169, 439/482, 219, 502, 909, 912; 324/754, 72.5, 324/133
See application file for complete search history.

(56) References Cited

U.S. PATENT DOCUMENTS

| | | | |
|---|---|---|---|
| 5,397,996 A * | 3/1995 | Keezer | 439/482 |
| 5,509,822 A * | 4/1996 | Negus et al. | 439/502 |
| 5,731,710 A * | 3/1998 | Mizuno et al. | 324/754 |
| 6,400,167 B1 * | 6/2002 | Gessford et al. | 324/72.5 |
| 2003/0224641 A1 * | 12/2003 | Kimbley | 439/219 |

* cited by examiner

*Primary Examiner*—P. Austin Bradley
*Assistant Examiner*—Felix O. Figueroa

(57) ABSTRACT

An electronic probe extender. In representative embodiments, an electronic probe extender is disclosed which includes a probe connector that is capable of electronic contact to an electronic test probe, an electronic signal conductor connected electronically to the probe connector, and an electronic probe tip connected electronically to the signal conductor. The electronic probe tip includes a tapered electronically conductive tip. The electronic probe tip is capable of electronic connection to an electronic test point.

12 Claims, 4 Drawing Sheets

ELECTRONIC PROBE EXTENDER

BACKGROUND

In the development and manufacture of modern electronic circuits, testing of the circuits, whether it be for design debug, design confirmation, or the troubleshooting of defective circuits, is an indispensable activity. When probing the electronic signals at individual locations on the circuits, it is usually necessary to hold or attach the tips of two electronic test probes to the circuit. The circuit could be located, for example, on a printed circuit board wherein the probing of a plated thru-hole via is a common choice. Vias are a popular probe location choice to probe as they provide, among other advantages, mechanical support in keeping the probe tip from slipping off the test point. Also, if, as is common, the printed circuit board is covered with a solder mask, scrapping the solder mask from the vias in order to obtain good electrical contact for the probe tips usually causes only minimal damage to the printed circuit boards.

There are two standard approaches to probing a printed circuit board via. The first approach is to manually hold the probe in contact with the outer layer via pad, and the second is to solder a probe tip to the outer layer via pad. Note that in either case, if present solder mask must be removed from the via in order for the test probe to make good electrical contact.

The manual contact approach requires two contact points, the first of which is usually driven at a signal potential while the second is usually held at ground potential while a measurement is made. In typical instances, an engineer attempts to balance a non-flexible probe tip on two very small plated thru-hole vias, each of which is approximately 0.020" in diameter. In the common situation in which solder mask covers the outer layer metal including the vias of the printed circuit board, it is necessary to scrape the solder mask off of the via pad, as well as any oxide that may have formed on the via pad metal. It is difficult to maintain two solid contact points for any extended period of time. Also, before the measurement is taken, the probe tips are usually filed down to a sharp point because the geometries involved are so small. When performed by hand, these types of modifications to the probe tips are difficult to control and, as such, may result in sufficient damage to the probe tips that they are no longer usable.

The soldering approach also requires two points of contact for a test. Again, the solder mask and any oxide existing on the via metal must be scrapped off of the via pad prior to beginning the test. Following this action, a small amount of solder is applied at the soldering temperature to the via and to a small wire to which the probe tip can be attached, forming both an electrical and a mechanical bond to hold the wire to the contact point on the printed circuit board. The soldering of the wire to the printed circuit board is a difficult procedure due to the smallness of the board attachment point. In addition, upon removal of the probe, the via pad may be inadvertently pulled free of the printed circuit board. Should this happen, the circuit path around the via may be opened, thereby, resulting in a destructive test. Even if the probe tip is successfully removed, there is usually a significant amount of solder left on and around the via pad. This remaining solder can result in additional capacitive coupling or even shorting to adjacent conducting geometries on the printed circuit board, thereby adversely affecting the signal integrity of the system.

SUMMARY

In representative embodiments, an electronic probe extender is disclosed which includes a probe connector that is capable of electronic contact to an electronic test probe, an electronic signal conductor connected electronically to the probe connector, and an electronic probe tip connected electronically to the signal conductor. The electronic probe tip includes a tapered electronically conductive tip. The electronic probe tip is capable of electronic connection to an electronic test point.

Other aspects and advantages of the present invention will become apparent from the following detailed description, taken in conjunction with the accompanying drawings, illustrating by way of example the principles of the invention.

BRIEF DESCRIPTION OF THE DRAWINGS

The accompanying drawings provide visual representations which will be used to more fully describe embodiments of the invention and can be used by those skilled in the art to better understand the invention and its inherent advantages. In these drawings, like reference numerals identify corresponding elements.

DETAILED DESCRIPTION

Figure 1:
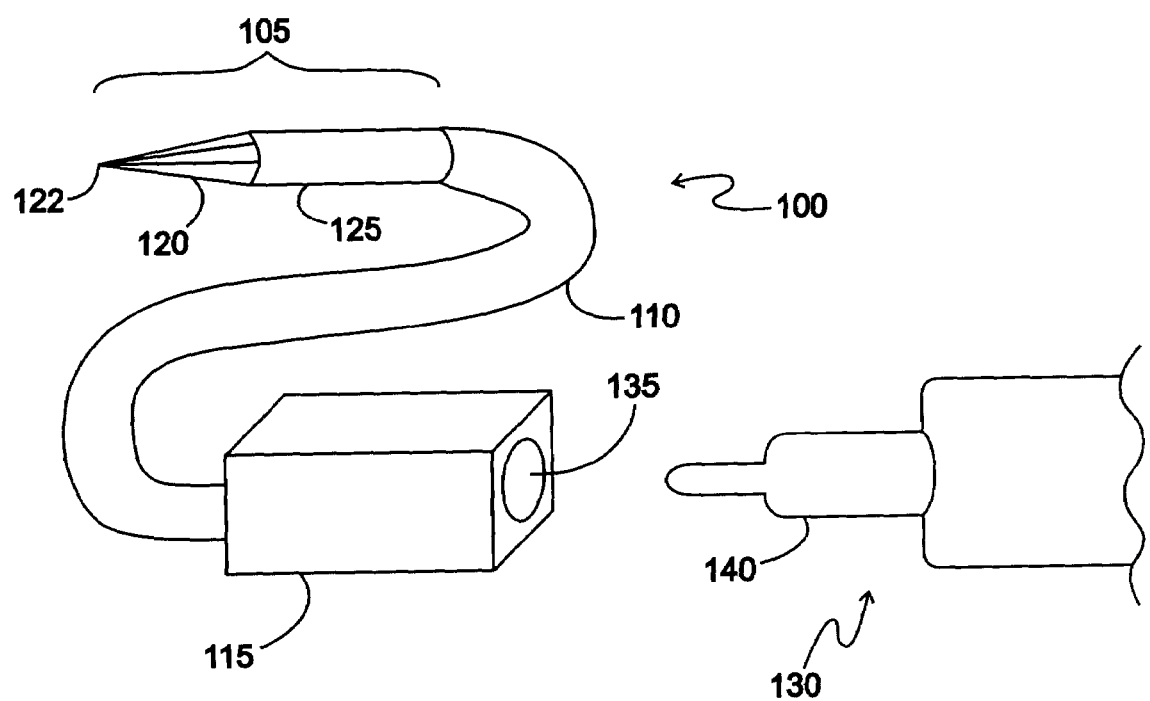
FIG. 1 is a drawing of an electronic probe extender in a representative embodiment.

Various embodiments of an electronic probe extender are shown in the drawings for purposes of illustration. Such devices can be used to obtain hands-free probing or testing of electronic devices and circuits. They are especially useful in the electronic test of printed circuit boards, and can be used, for example, with the test probes of an oscilloscope, logic analyzer, or other electronic tester. They provide greater contact stability for both the signal and ground test points on the item under test. In particular, they provide a non-destructive method for probing individual signals on printed circuit boards using their plated thru-hole vias.

In the following detailed description and in the several figures of the drawings, like elements are identified with like reference numerals.

FIG. 1 is a drawing of an electronic probe extender 100 in a representative embodiment. In FIG. 1, the electronic probe extender 100 comprises an electronic probe tip 105, an electronic signal conductor 110, and a probe connector 115. The electronic probe tip 105 comprises a tapered tip 120, also referred to herein as a tapered electronically conductive tip 120, which has a pointed end 122 and may optionally comprise a tip extension 125. Also shown in FIG. 1 is an electronic test probe 130 which could be, for example Agilent Technologies 1152A oscilloscope probe and which in a typical situation would be connected by means of a conductor, such as a flexible metal wire, to an oscilloscope, logic analyzer, or other electronic tester. This conductor is not shown in FIG. 1. In operation, a test probe tip 140 of the electronic test probe 130 is inserted into a cavity 135 of the probe connector 115.

Figure 2:
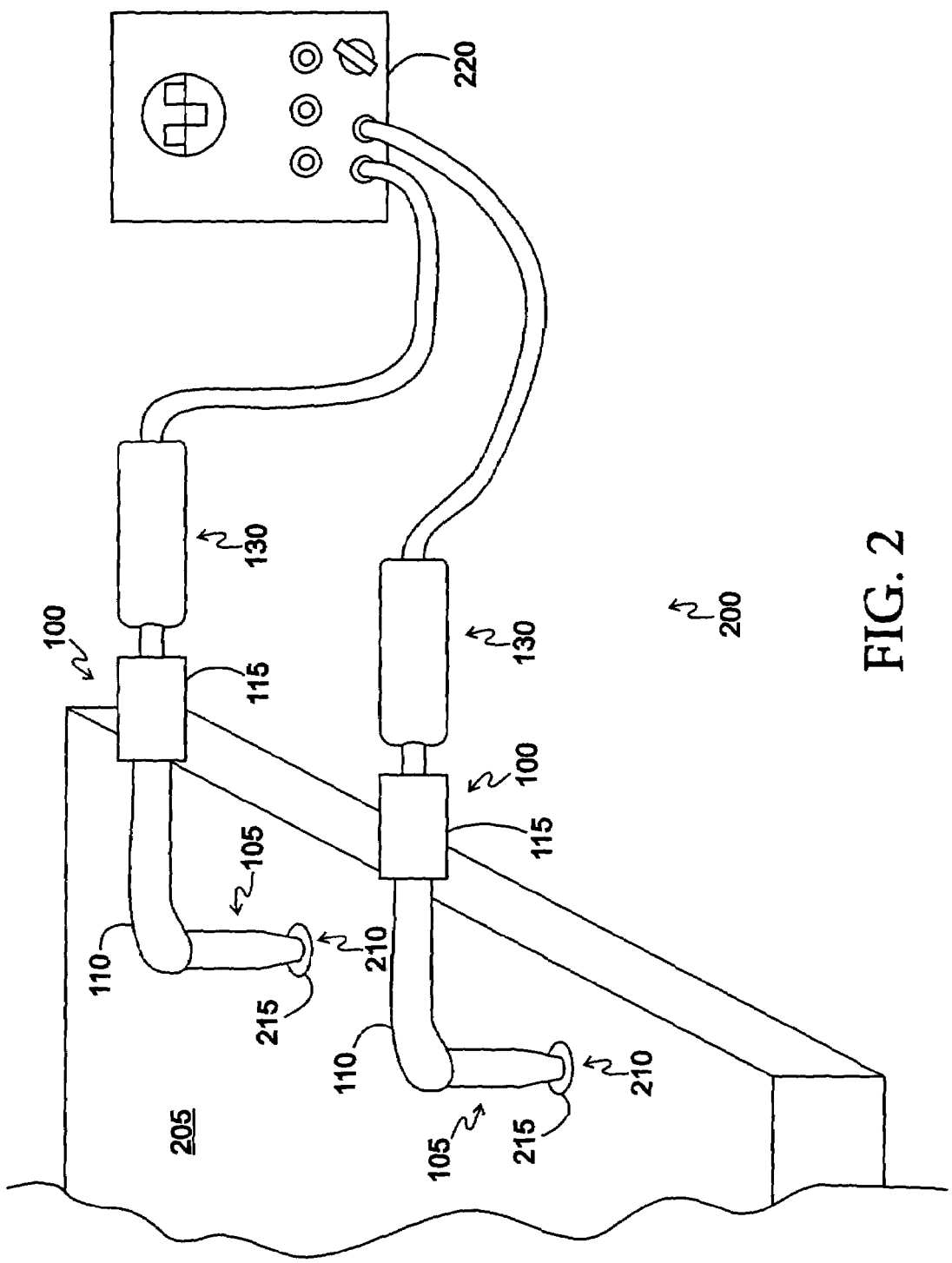
FIG. 2 is a drawing of a test system using electronic probe extenders to test an electronic circuit in a representative embodiment.

FIG. 2 is a drawing of a test system using electronic probe extenders to test an electronic circuit in a representative embodiment.

FIG. 2 is a drawing of a test system 200 using electronic probe extenders 100 to test an electronic circuit 205 in a representative embodiment. The electronic circuit 205 could be, for example, printed circuit board 205. In FIG. 2, an electronic test machine 220, also referred to herein as an electronic tester 220 and as a tester 220, which in this representative example is shown as an oscilloscope 220, but which could be also a logic analyzer 220, a voltmeter 220, or other electronic tester 220, has two electronic test probes 130 connected to it. The tester 220 could be either a standard off the shelf tester or a custom designed and fabricated tester. Each of the two electronic test probes 130 is connected to their respective probe connector 115. In this representative example, each of the electronic test probes 130 is inserted into the cavity 135 (see FIG. 1) of the corresponding probe connector 115. In the representative example of FIG. 2, test points 210, also referred to herein as electronic test points 210, of interest are plated thru-hole vias 215 fabricated on the printed circuit board 205. Hands-free, mechanically stable testing of the two test points 210 of FIG. 2 is obtained by inserting one of the tapered tips 120 into each of the test points 210. Vias 215 could be fabricated in the printed circuit board 205 using the standard printed circuit board fabrication processes of first drilling a hole through (or partially through) the printed circuit board then using some combination of metal deposition and metal plating to cover the surface of the hole and the adjacent areas of the top and/or bottom surfaces of the printed circuit board 205 with a layer or layers of metal.

Figure 3:
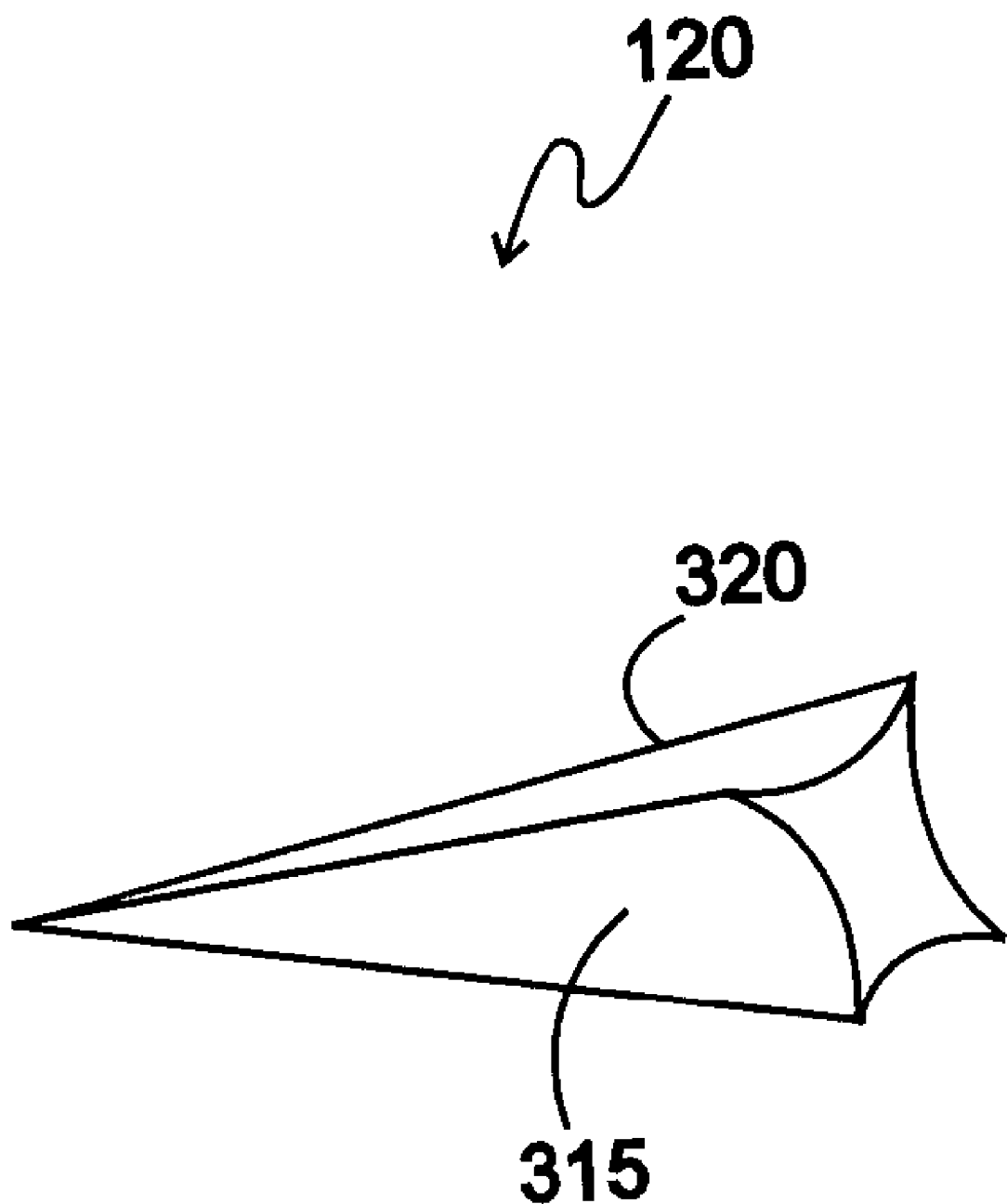
FIG. 3 is a drawing of a representative embodiment of a tapered tip.

FIG. 3 is a drawing of a representative embodiment of the tapered tip 120. In the representative embodiment of FIG. 3, the tapered tip 120 has four grooves 315 formed parallel to the axis of the taper resulting in four ridges 320 also extending parallel to the axis of the taper. Other embodiments of grooves 315 and ridges 320 are also possible, for example five, six, seven, eight, etc. grooves 315 and ridges 320. The purpose of these ridges 320 with the associated groves 315 will be explained in the following discussion of FIG. 4.

Figure 4:
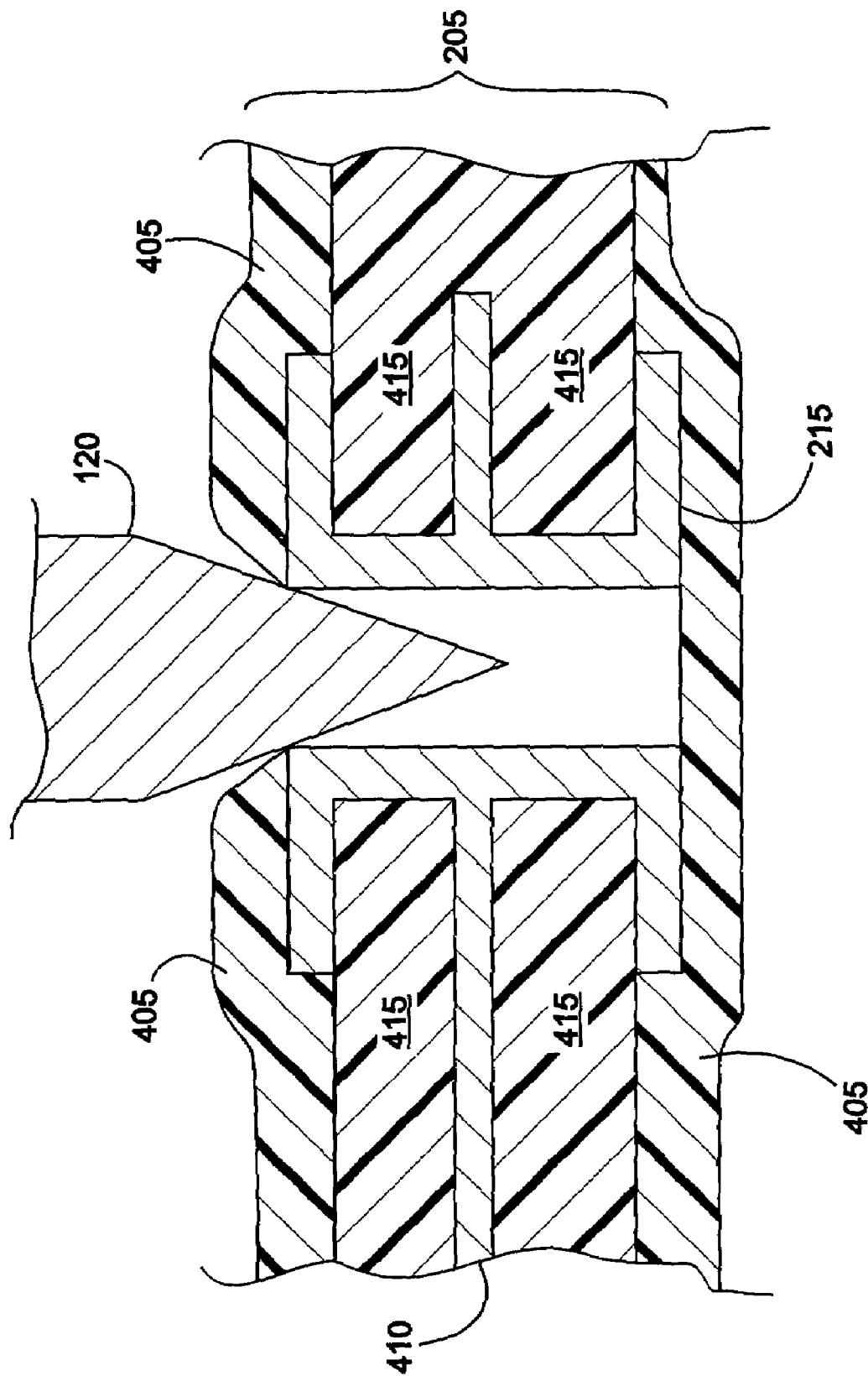
FIG. 4 is a drawing of a cross-sectional view of an electronic probe extender inserted into a via of a printed circuit board in a representative embodiment.

FIG. 4 is a drawing of a cross-sectional view of the electronic probe extender 100 inserted into a via 215 of the printed circuit board 205 in a representative embodiment. In this detailed view of FIG. 4, the tapered tip 120 of the electronic probe tip 105 is shown inserted through the solder mask 405 on one side of the printed circuit board 205 and into the opening of the via 215. Inserting the tapered tip 120 into the via 215 breaks the solder mask 405 allowing electronic contact between the metal of the via 215 and the conductive tapered tip 120 providing both a hands-free and a mechanically stable electronic connection between the test point 210 at the via 215. The drawing of FIG. 4 shows the lack of solder mask 405 over the top side of the via 215. Solder mask 405 on the lower side of the printed circuit board 205 is undisturbed as the tapered tip 120 did not extend completely through the hole. For ease of illustration, pieces of solder mask 405 disrupted in the penetration process are not shown in FIG. 4. Also shown in FIG. 4 are an innerlayer metal trace 410 electrically connected to the via 215 and insulating layers 415 which could be, for example, fabricated using FR-4 material.

Representative dimensions for the various components of the electronic probe extender 100 are as follows: (1) tapered tip 120—0.05" long with a diameter at its maximum of 0.008", (2) tip extension 125—0.35" long with a diameter of 0.008", (3) electronic signal conductor 110—0.5" long, and (4) probe connector 115—0.5" long.

In a representative embodiment, the electronic probe extender 100 comprises a conically shaped tapered tip 120 having a number of ridges 320. The pointed end 122 of the tapered tip 120 aids in penetrating the solder mask 405, and the ridges 320 on the tapered tip 120 aid in making contact with the metal of the via 215 at the test point 210. The optional, cylindrically shaped tip extension 125 is attached to the tapered tip 120. The tip extension 125 may be fabricated separately from the tapered tip 120 and then attached to it, or the tip extension 125 and the tapered tip 120 may be fabricated as a single unit. The tip extension 125 provides a convenient means for grasping and placing the electronic probe tip 105. Grasping the electronic probe tip 105 by the tip extension 125, the test operator can accurately direct the electronic probe tip 105 to the test point 210 and may easily penetrate any solder mask 405 and/or oxide present. The tip extension 125, if it is present, or the tapered tip 120, if the tip extension 125 is not present, is connected to the electronic signal conductor 110 which is typically a flexible wire. The electronic signal conductor 110 is then connected to the probe connector 115 which could be fabricated as a plastic casing that accepts the test probe tip 140 of a standard or custom piece of test equipment 220 which could be, for example, an oscilloscope 220, a logic analyzer 220, a voltmeter 220, or other electronic tester 220. The probe connector 115 is constructed such that the test probe tip 140 inserts into the cavity 135 of the probe connector 115 and is held there by means of a press fit. Other embodiments of the probe connector 115 are possible. For example, the probe connector 115 could be a clip, such as an alligator clip, which could clip onto the test probe tip 140 without the necessity of the cavity 135.

When a measurement is made, two electronic probe extenders 100 are used, one typically for the signal test point 210 and the other typically for the ground test point 210. Differential measurements are also possible using the electronic probe extenders 100, as well as measurements using a reference potential other than that of ground. Since the tapered tip 120 is inserted into the plated thru-hole via 215, the via 215 itself will provide the necessary force to hold the electronic probe tip 105 in place. In a representative embodiment, the conically shaped tapered tip 120 has 4 sharp ridges that extend from the point to the base of the tapered tip 120. These ridges pierce through any solder mask 405 and/or oxide that may exist and make a solid electrical connection to the metallized test point 210 on the printed circuit board 205.

It is also possible to use the electronic probe extender 100 with test points 210 other than vias 215. For example, one or more test points 210 could be a conductive lead, conductive pad or the like on a device or structure on the electronic circuit 205. In addition, the probe connector 115, the electronic signal conductor 110, and/or the tip extension 125 can be encased in an external insulating layer. Further, in various implementations, the electronic signal conductor 110 can be flexible.

In summary, a non-destructive, self adhering electronic probe extender 100 is disclosed in representative embodiments. In operation, the probe tip extender penetrates the printed circuit board at a drilled hole. The shape of the electronic probe extender 100 is such that it pierces through the solder mask and any oxide which might have formed on the metal of the plated hole. This procedure allows the test operator to make a hands-free measurement that provides a mechanically stable connection to the probing point. In addition, when the electronic probe extender 100 is removed from the target, it leaves the system with only a part of the solder mask compromised. The electronic probe extender 100 eliminates the risk of removing a via pad or leaving extra solder on the printed circuit board, as often happens in other test approaches.

Primary advantages of the embodiments as described herein over prior devices are that the present embodiments provide the ability to make reliable, hands-free measurements while causing only minimal damage (solder mask, if present, is compromised at the test point) to the circuit being tested.

While the present invention has been described in detail in relation to preferred embodiments thereof, the described embodiments have been presented by way of example and not by way of limitation. It will be understood by those skilled in the art that various changes may be made in the form and details of the described embodiments resulting in equivalent embodiments that remain within the scope of the appended claims.

What is claimed is:

1. An electronic probe extender, comprising:
   a probe connector capable of electronic contact to an electronic test probe;
   an electronic signal conductor connected electronically to the probe connector; and
   an electronic probe tip connected electronically to the electronic signal conductor, wherein the electronic probe tip comprises a tapered electronically conductive tip, wherein the electronic probe tip is capable of electronic connection to an electronic test point, wherein the tapered electronically conductive tip comprises at least one ridge, wherein the electronic signal conductor is flexible, and wherein electronic and mechanical connection of the electronic test probe to the probe connector is obtainable by means of a press fit of the electronic test probe tip into a cavity in the probe connector.

2. The electronic probe extender of claim 1, wherein the probe connector is further encased in an external insulating layer.

3. The electronic probe extender of claim 1, wherein the electronic signal conductor is further encased in an external insulating layer.

4. The electronic probe extender of claim 1, wherein the tip extension is further encased in an external insulating layer.

5. The electronic probe extender of claim 1, wherein the cavity is circular in cross-section.

6. The electronic probe extender of claim 1, further comprising an electronic test probe, wherein the electronic test probe is electronically connected to the probe connector.

7. An electronic probe extender, comprising:
   a probe connector capable of electronic contact to an electronic test probe;
   an electronic signal conductor connected electronically to the probe connector;
   an electronic probe tip connected electronically to the electronic signal conductor, wherein the electronic probe tip comprises a tapered electronically conductive tip, wherein the electronic probe tip is capable of electronic connection to an electronic test point, wherein the
   tapered electronically conductive tip comprises at least one ridge, wherein the electronic signal conductor is flexible, and wherein electronic and mechanical connection of the electronic test probe to the probe connector is obtainable by means of a press fit of the electronic test probe tip into a cavity in the probe connector; and
   a tip extension, wherein the tip extension is interposed between the tapered electronically conductive tip and the electronic signal conductor and wherein the tip extension is capable of transferring an electronic signal from the tapered electronically conductive tip to the electronic signal conductor.

8. The electronic probe extender of claim 7, wherein the probe connector is further encased in an external insulating layer.

9. The electronic probe extender of claim 7, wherein the electronic signal conductor is further encased in an external insulating layer.

10. The electronic probe extender of claim 7, wherein the tip extension is further encased in an external insulating layer.

11. The electronic probe extender of claim 7, wherein the cavity is circular in cross-section.

12. The electronic probe extender of claim 7, further comprising an electronic test probe, wherein the electronic test probe is electronically connected to the probe connector.

* * * * *